United States Patent [19]

Suemura et al.

[11] Patent Number: 5,687,181
[45] Date of Patent: Nov. 11, 1997

[54] PARALLEL DATA TRANSMISSION UNIT USING BYTE ERROR CORRECTING CODE

[75] Inventors: Yoshihiko Suemura; Naoya Henmi, both of Tokyo, Japan

[73] Assignee: NEC Corporation, Japan

[21] Appl. No.: 412,720

[22] Filed: Mar. 29, 1995

[30] Foreign Application Priority Data

Mar. 30, 1994 [JP] Japan .................. 6-059711

[51] Int. Cl.[6] .................................................. H03M 13/22
[52] U.S. Cl. .................................. 371/37.6; 371/38.1
[58] Field of Search .......................... 371/37.1, 37.6, 371/38.1, 39.1, 40.1

[56] References Cited

U.S. PATENT DOCUMENTS

| 5,490,155 | 2/1996 | Abdoo et al. | 371/40.1 |
| 5,570,356 | 10/1996 | Finney et al. | 370/85.9 |
| 5,570,379 | 10/1996 | Sasaki et al. | 371/42 |

OTHER PUBLICATIONS

"Fibre Channel –Physical and signaling interface (FC-PH)", FC–PH REV 4.1, Aug. 12, 1993, pp. 1–96.
S. Kaneda, "Single Byte Error Correcting–Double Byte Error Detecting Codes for Memory Systems", IEEE Transactions on Computers, vol. C–31, No. 7, Jul. 1982.
M. Y. Hsiao, "A Class of Optimal Minimum Odd–weight–column SEC-DED Codes", SEC-DED Codes, Jul. 1970, pp. 395–401.
A.K. Bhatt, "A High–Speed Parallel Encoder/Decoder For b–Adjacent Error–Checking Codes", 3rd USA–JAPAN Computer Conference 1978, pp. 203–207.

*Primary Examiner*—Stephen M. Baker
*Attorney, Agent, or Firm*—Ostrolenk, Faber, Gerb, & Soffen, LLP

[57] ABSTRACT

A parallel signal of a k bit width is converted such that every m bits of width is made a byte. It is then coded by a plurality i of encoders into a t byte error correcting code in which a byte length is of m bits and a code length is of l bytes. The coded parallel signal is interleaved by an interleaver and is distributed into a plurality l of transmitters. Each transmitter converts the parallel signal of an mi bit width into a serial signal and transmits the converted signal. Each receiver converts the received serial signal into a parallel signal of an mi bit width and outputs the signal thus converted. The signals outputted from a plurality i of receivers are deinterleaved by a de-interleaver, and the deinterleaved signals are inputted to a plurality i of decoders. The decoders carry out correction of a t byte error in which one byte is of m bits, and integrates the signals outputted therefrom and outputs a parallel signal of a k bit width. By making use of the byte error correcting code, the interleaver, and the deinterleaver, the parallel data transmission unit provides for the correction of a byte error having a byte length longer than that of the code, and also provides for the reduction in scale of the encoders and decoders. Each of i, k, l, and m is an integer not less than 2.

4 Claims, 5 Drawing Sheets

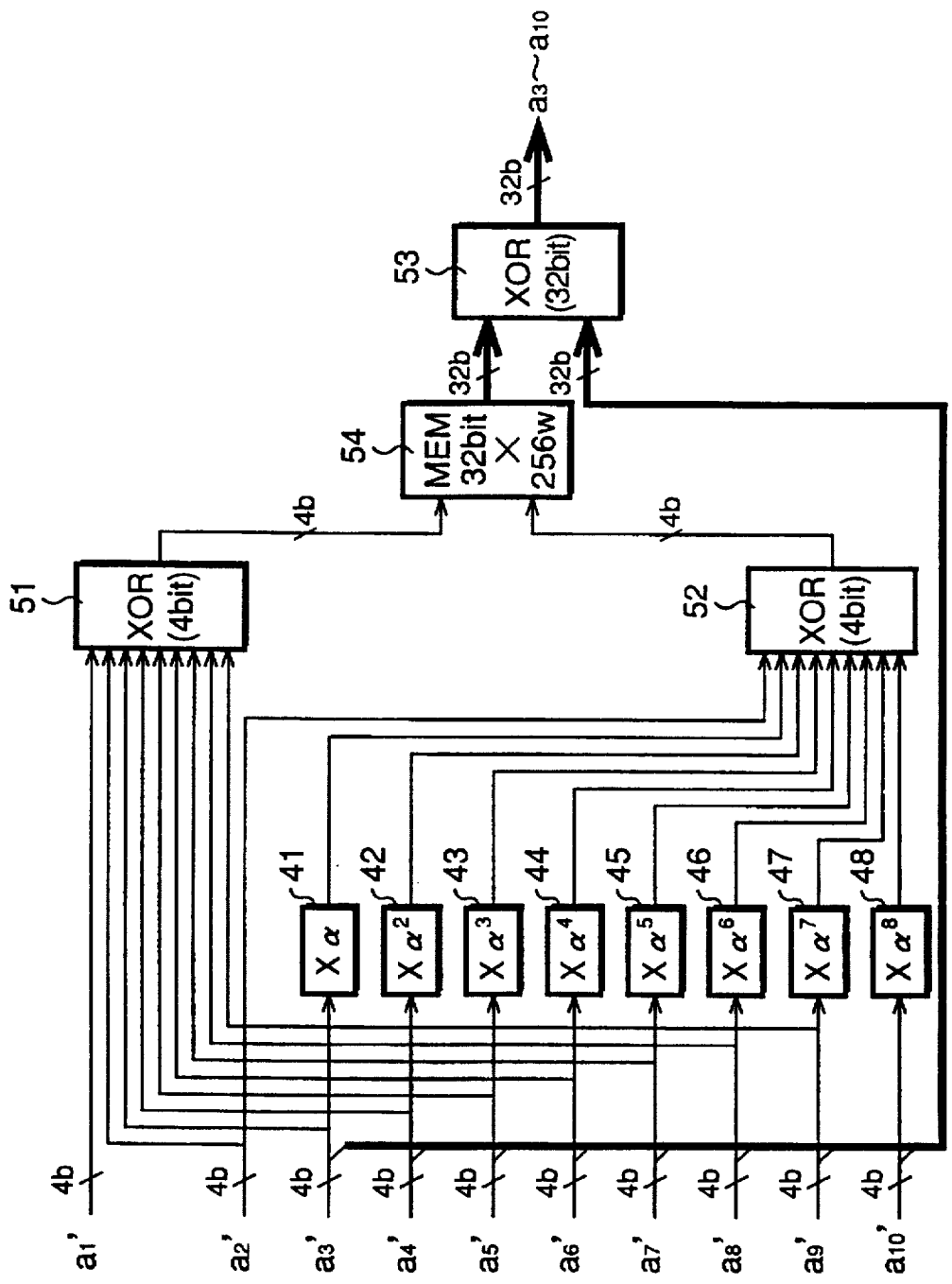

PARALLEL DATA TRANSMISSION UNIT USING BYTE ERROR CORRECTING CODE

BACKGROUND OF THE INVENTION (1) Field of the Invention

The present invention relates to a data transmission unit, and more particularly to a data transmission unit which is used in interconnection between units or boards of, for example, a computer, or used in interfaces of transmission systems or switching systems.

(2) Description of the Related Art

For a data transmission unit interconnecting processors and memories in a computer, there is a need to transmit, with no error and minimum latency, parallel digital signals which comprise time-series digital signals where each is a plurality of bits in width, for example, 32 bits or 64 bits. Especially, in a parallel computer which has been developed recently, network interconnecting a plurality of processors and memories needs a large number of mass data transmission units. Such a data transmission unit employs a conventional electrical transmission technology using, for example, a coaxial cable.

In recent years, with a demand for higher clock frequency and a larger scale of systems with an increased number of processors in parallel computers, conventional electrical transmission has approached the limits of its abilities for transmission capacity, transmission distance, etc. Thus, research is in progress on the application of optical transmission technology. If use is made of an optical transmission system, it is possible to increase the capacity of a transmission line and the distance thereof remarkably, as well as to decrease the diameter of a cable compared with a conventional electrical transmission system. However, there exists a problem that, in general, optical transmission systems are only guaranteed for a bit error rate of about $10^{-12}$. Therefore, when optical transmission technology is applied to the above-mentioned data transmission unit, there is a need for a method of error control. For example, in Fibre Channel (Fibre Channel-Physical and signaling interface (FC-PH) REV 4.1 ANSI X3T11 Aug. 12, 1993) of which standardization is in progress by ANSI (American National Standard Institute), a method has been investigated where CRC (Cyclic Redundancy Check) is added to data and, when an error is detected, there is a retransmission of the data.

However, in a field such as super computers where especially high speed data transmission is demanded, the use of error correcting code rather than the error detection and recovery as in the Fibre Channel is more suited. There is almost no prior example of a practical use of the above-mentioned parallel data transmission unit employing the error correcting code method. However, in the same computer field, the error correcting code method is frequently used, for example, in a semiconductor storage unit. In the semiconductor storage unit as well as the parallel data transmission unit, a parallel digital signal having a plurality of bits in width is inputted and outputted, and it is demanded that the parallel digital signal is error-free. Especially, in a main storage unit, it is required that the latency to be minimized. There are many factors required that are common in both the parallel data transmission unit and the semiconductor storage unit. A similar situation may be considered about the application of the error correcting code. In the field of the semiconductor storage unit, the error correcting code called an SEC-DED code (Single bit Error Correcting-Double bit Error Detecting code) given in, for example, M. Y. Hsiao. "A Class of Optimal Minimum Odd-Weight-Column SEC-DED Codes", IBM J. Res. Develop., July 1970, pp. 395–400, is generally used. This is because, for example, a storage element organized by 1 bit is generally used in the conventional semiconductor storage unit and a decoding circuit of SEC-DED code can be configured by a parallel circuit which comprises combinational logic circuits, and is advantageous to minimize the latency. In recent years, however, the number of units using a byte-organized storage element has increased with the advancement of highly integrated storage elements, and research is in progress on byte error correcting code as a code suitable for this unit. (S. Kaneda and E. Fujiwara "Single Byte Error Correcting-Double Byte Error Detecting Codes for Memory Systems" IEEE Trans. or Computers Vol. C-31, No. 7, July 1982)

As mentioned above, application of an error correcting code to a parallel data transmission unit may be thought of as being similar to the case of the semiconductor storage unit so that one solution is to use an SEC-DED code. FIG. 1 shows a configuration in which a (72, 64) SEC-DED code, comprising information bits of 64 bits and check bits of 8 bits, is applied to a data transmission unit having a parallel arrangement of a plurality of transmitters 21 and receivers 22 which deal with a parallel digital signal having 8 bits in width, and which unit transmits a parallel digital signal having 64 bits in width. Each of the transmitters 21 includes a parallel/serial converter (P/S) 13 and an optical transmitter (OTx) 14, and each of the receivers 22 includes an optical receiver (ORx) 15 and a serial/parallel converter (S/P) 16. The transmitter 21 is coupled to the receiver 22 through an optical fiber 31. This solution has the advantage of decreasing the scale of an encoder (COD) 11 and a decoder (DEC) 18 and of minimizing the latency. In the drawings, reference numeral 3 denotes a byte divider, and reference numeral 6 denotes a byte integrater.

It may also be effective to apply a byte error correcting code to a parallel data transmission unit.

In the transmission unit shown in FIG. 1, for example, parallel digital signals 1 to be transmitted are divided into a certain number of grouped bits of a width to make bytes (in FIG. 1, one byte is composed of 8 bits, but is not necessarily limited to 8 bits), and every byte is processed by time division multiplexing and transmitted by a set of a transmitter 21 and a receiver 22. In this transmission unit, there is a high probability for the occurrence of an error in a byte as a unit (a byte error) due to, for example, deviation of frame synchronization or failure of the transmitter and the receiver. FIG. 2 shows a configuration of a transmission unit, similar to that shown in FIG. 1, which uses a (80, 64) Reed Solomon code as one kind of a byte error correcting code. This code can correct one byte error in a 10 byte code-word in which one byte length is of 8 bits. Therefore, the transmission unit shown in FIG. 2 can correct a burst error which has occurred in a pair of the transmitter and the receiver and which has an arbitrary length.

In the transmission unit using the SEC-DED code as shown in FIG. 1, there is a problem that the unit cannot correct the burst error. Therefore, the unit can neither cope with the deviation of the frame synchronization or the failure of the transmitter and the receiver nor be effective to a comparatively short burst error caused, for example, by a surge from a power source system.

In the transmission unit using the byte error correcting code as shown in FIG. 2, there is a problem that both the scale of the encoder (COD) 11 or the decoder (DEC) 18 and the signal delay become large. This is because the processes in encoding and decoding the byte error correcting code generally become complex compared with those of the SEC-DED code. For example, a Reed Solomon code having one byte length of m bits needs calculation in $2^m$-dimensional Galois Field. When m is not less than 2, it is a general method to store the calculation result as a table to a memory or to use a combinational logic circuit in order to minimize the signal delay by the calculation in the $2^m$-dimensional Galois Field. Because the combination number per calculation becomes $2^{2m}$, the longer the byte length becomes, the larger the size of the table becomes so that the scale of the memory or the combinational logic circuit and the delay increase. For example, the unit shown in FIG. 2, where the byte length is of 8 bits, needs a memory size of 65536 words per calculation. Especially, in this transmission unit using the time division multiplexing, there are demands for a larger number of time division multiplexing operations in order to decrease the number of the transmitters and the receivers, so that the byte length has a tendency to be long.

SUMMARY OF THE INVENTION

An object of the invention, therefore, is to overcome the problems existing in the prior art and to provide a parallel data transmission unit in which an error correcting code is used and which enables the correction of a burst error or a byte error and also enables the scaling down of the encoding and decoders.

Another object of the invention is to provide a parallel data transmission unit which transmits a plurality "k" ("k" being an integer not less than 4) of time-series digital signals using a plurality of transmitters and receivers, comprising:

a byte divider which divides the "k" time-series digital signals into a plurality "i" ("i" being an integer not less than 2) of parallel digital signals each composed of a "d" ("d" being an integer not less than 1) byte width with each byte being composed of "m" bits ("m" being an integer not less than 2 and m=k/(d·i));

a plurality "i" of encoders each of which encodes parallel digital signals each composed of a "d" byte width into byte error correcting codes each composed of a "l" ("l" is an integer not less than 2) byte width capable of correcting "t" byte-errors within one code-word;

an interleaver which interleaves the parallel digital signals outputted from the plurality "i" of encoders and inputs them to the plurality of transmitters;

a deinterleaver which deinterleaves parallel digital signals outputted from the plurality of receivers in correspondence to an interleaving format at the transmitting end;

a plurality "i" of decoders each of which decodes parallel digital signals each composed of a "l" byte width outputted from the deinterleaver into parallel digital signals each composed of a "d" byte width correcting "t" byte-errors within one code-word; and a byte integrater which integrates the parallel digital signals each composed of the "d" byte width outputted from the "i" decoders, and outputs "k" time-series digital signals.

According to a second aspect of the invention, in the above parallel data transmission unit, a set of the transmitter and the receiver carries out transmission of parallel digital signals of an "n" bit width, in which n is given by the following equation:

n=mti/p (where p is natural number).

In the first aspect of the invention, the byte error correcting code having one byte length of m bits is used. This enables the correction of a byte error having the width of mi bits which is longer than the byte length of the code itself. Therefore, it is possible to shorten sufficiently the byte length m of the byte error correcting code itself so that the encoder and the decoder can be constructed using small scale combination logic circuits or memories. As a result, although the number of the encoders and the decoders is increased compared with the configuration shown in FIG. 2, it is possible to decrease remarkably the amount of hardware in the whole system. Also, it is possible to decrease the data delay in the encoder and the decoder to an extent comparable to the case where an SEC-DED code is used.

Especially, in the case of the second aspect of the invention, it is possible to correct the burst error having an arbitrary length that has occurred in p pairs of the transmitters and the receivers. Therefore, even if the deviation of the frame synchronization or the failure in the p pairs of the transmitters and the receivers occurs, it is possible to effect the complete correction of the error caused thereby.

BRIEF DESCRIPTION OF THE DRAWINGS

The above and other objects, features and advantages of the present invention will be apparent from the following description of preferred embodiments of the invention explained with reference to the accompanying drawings, in which:

FIG. 6 is a diagram showing the configuration of a decoder for error correcting code used in the first and second embodiments according to the present invention.

PREFERRED EMBODIMENTS OF THE INVENTION

Preferred embodiments of the invention are explained with reference to the drawings.

Figure 1:
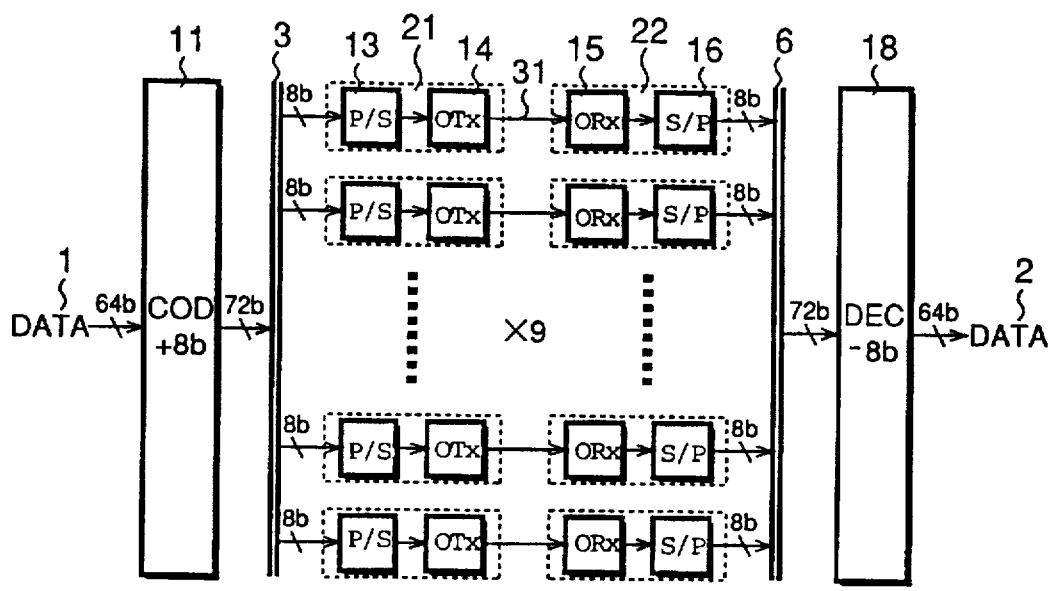
FIG. 1 is a diagram showing the configuration of a first conventional parallel data transmission unit.
Figure 2:
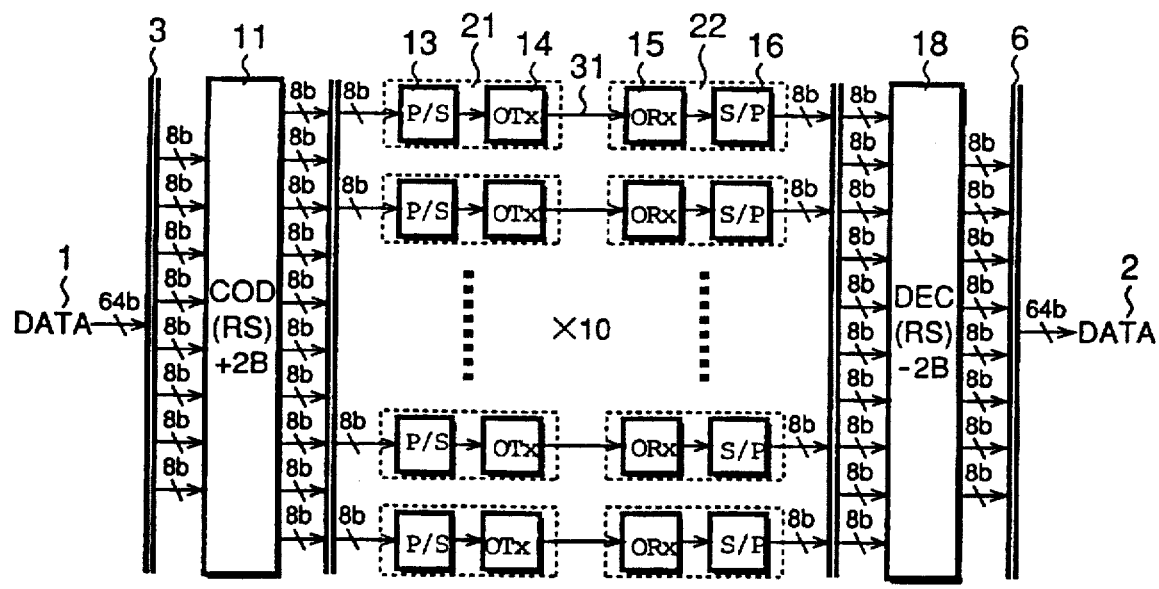
FIG. 2 is a diagram showing the configuration of a second conventional parallel data transmission unit.
Figure 3:
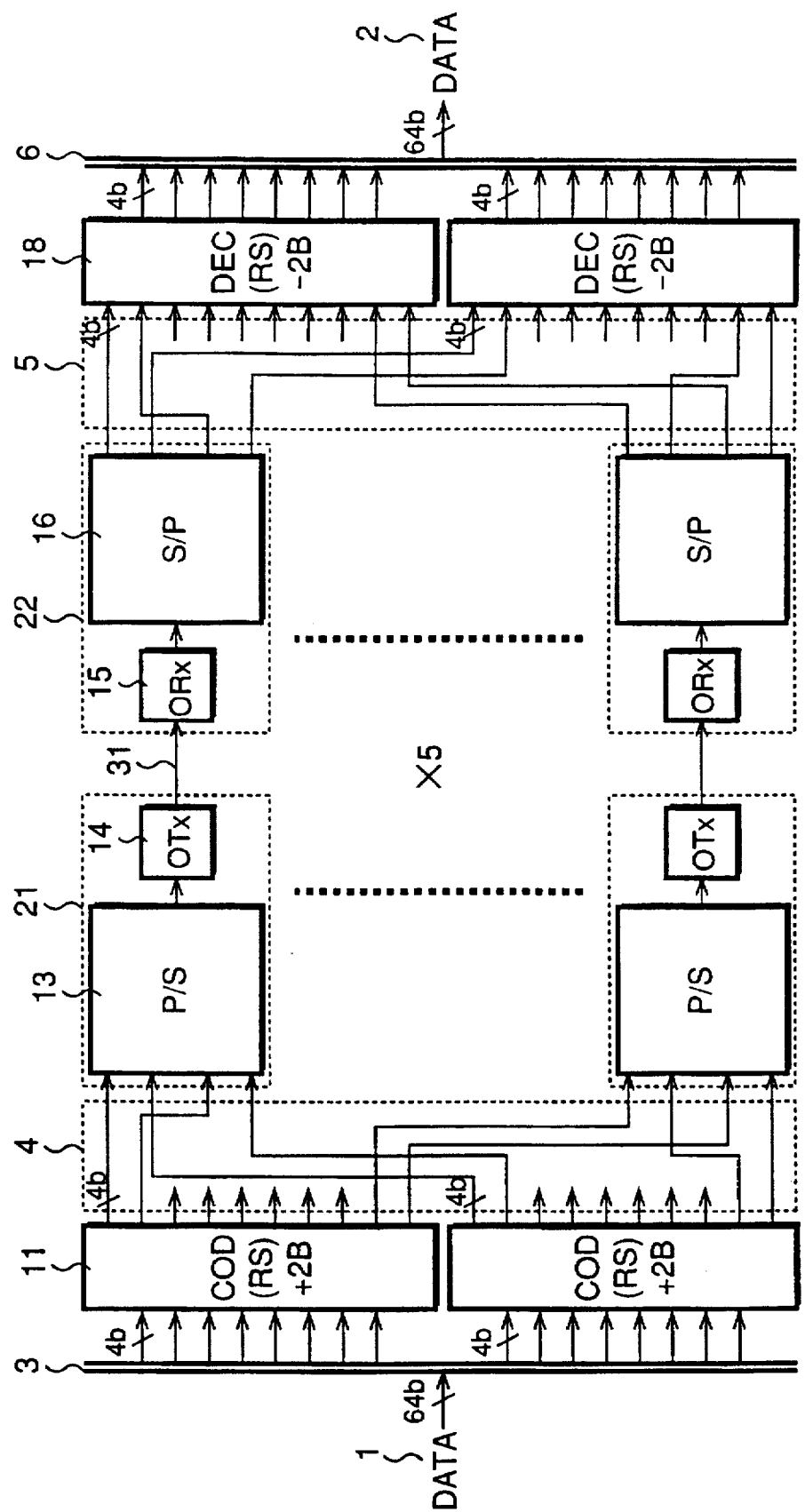
FIG. 3 is a diagram showing the configuration of a parallel data transmission unit of a first embodiment according to the present invention.

FIG. 3 shows the configuration of a first embodiment according to the present invention. The first embodiment is the case where k=64, m=4, d=8, i=2, t=1, and l=10 and where the condition of the second embodiment is not satisfied. Use is made of a one byte error correcting Reed Solomon code in which a byte length is of 4 bits and a code length is of 10 bytes.

A parallel digital signal 1 which has a data width of 64 bits with 125 Mb/s of the transmission rate per bit width is divided into two parallel digital signals each of a 8 byte width with each byte being composed of 4 bits by byte divider 3. The divided signals are inputted to encoders for error correcting code (COD) 11, respectively. In the encoder 11, the parallel signal inputted thereto is encoded into a one byte error correcting Reed Solomon code in which a byte length is of 4 bits and a code length is of 10 bytes. The parallel signal being 10 bytes in width is outputted from the encoder 11 and is distributed with 2 bytes being present in every five transmitters 21 by an interleaver 4. One byte is composed of 4 bits so that, in each transmitter 21, a signal being 8 bits in width is distributed from each of the two encoders 11, and the parallel signal inputted will have a total of 16 bits in width. The transmitter 21 comprises a parallel/serial converter (P/S) 13 and an optical transmitter (OTx) 14. The parallel signal 16 bits in width inputted thereto is time-division-multiplexed and is transmitted as one serial optical signal having a bit rate of 2 Gb/s. The optical signals outputted from the five transmitters 21 are transmitted through five optical fibers 31 and are received by five receivers 22. The receiver 22 comprises an optical receiver (ORx) 15 and a serial/parallel converter (S/P) 16, and converts the serial optical signal received thereby into a parallel electrical signal being 16 bits in width. The parallel signal 16 bits in width outputted from the receiver 22 is deinterleaved by a deinterleaver 5 in correspondence to the interleaving format at the transmitting end, and is inputted to two decoders for error correcting code (DEC) 18. The decoder 18 carries out one byte error correction with respect to the signal 10 bytes in width inputted thereto and outputs a signal 8 bytes in width. A signal having a total of 16 bytes in width outputted therefrom is integrated by means of a byte integrater 6 and is outputted as a parallel digital signal 2 being 64 bits in width. In this transmission unit, it is possible to correct a byte error having the length of 8 bits which is double the byte length (4 bits) of the used byte error correcting code itself.

Figure 5:
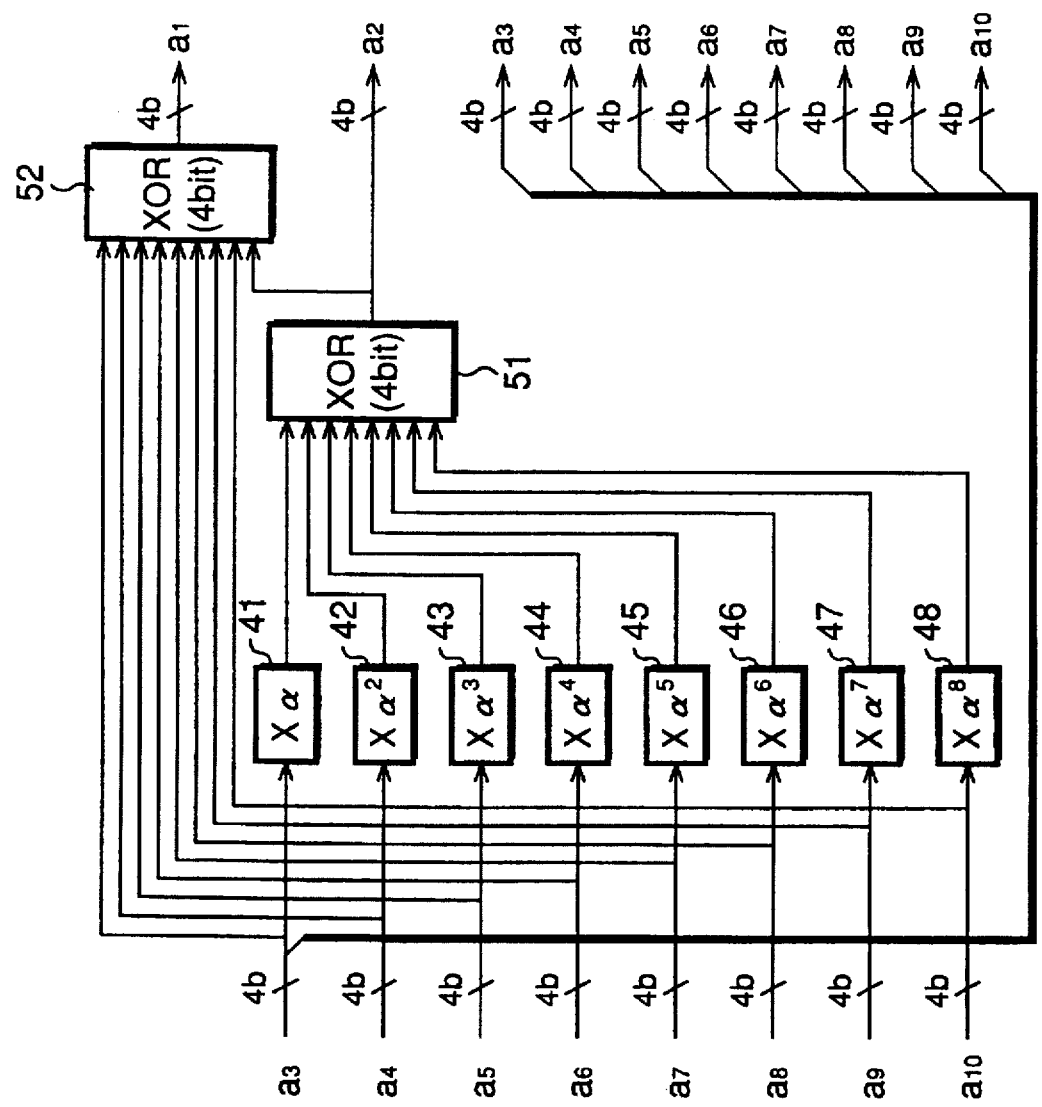
FIG. 5 is a diagram showing the configuration of an encoder for error correcting code used in the first and second embodiments according to the present invention.

FIGS. 5 and 6 show examples of configurations of encoder (COD) 11 and decoder (DEC) 18. The manner of the encoding will now be explained hereinafter. When the primitive element of Galois Field $GF(2^4)$ is set to be $\alpha$, a code $\{a_1, a_2, \ldots, a_{10}\}$ over Galois Field $GF(2^4)$ satisfying the following equation is a one byte error correcting Reed Solomon code.

$$\begin{bmatrix} 1 & 1 & 1 & 1 & \ldots & 1 \\ 0 & 1 & \alpha & \alpha^2 & \ldots & \alpha^8 \end{bmatrix} \begin{bmatrix} a_1 \\ a_{10} \end{bmatrix} = 0 \quad (1)$$

Therefore, information symbols are set to be $a_3, a_4, \ldots a_{10}$, check symbols $a_1, a_2$ are obtained by the following equations.

$$a_2 = \alpha a_3 + \alpha^2 a_4 + \ldots + \alpha^8 a_{10} \quad (2)$$

$$a_1 = a_2 + a_3 + a_4 + \ldots + a_{10} \quad (3)$$

The encoder shown in FIG. 5 operates on the equations (2) and (3). The first multiplication circuit 41 shown in FIG. 5 conducts the multiplication in Galois Field $GF(2^4)$ in which a signal $a_3$ having 4 bits in width inputted thereto is multiplied by a four-dimensional binary vector $\alpha$. Because there are a maximum of 16 combinations in the operation, it is possible to configure the multiplication circuit 41 by a simple combinational logic circuit. Similarly, multiplications of $a_4, a_5, \ldots, a_{10}$ and $\alpha^2, \alpha^3, \ldots \alpha^8$ are conducted by means of multiplication circuits 42 through 48, respectively. Each of the first exclusive-OR circuit 51 and the second exclusive-OR circuit 52 outputs a sum of every bit of a plurality of parallel signals each of which has 4 bits in width inputted thereto. Based on the equations (2) and (3), the signal having 4 bits in width outputted from the first exclusive-OR circuit 51 is the check symbol $a_2$, and the signal having 4 bits in width outputted from the second exclusive-OR circuit 52 is the check symbol $a_1$. In this way, the encoding is realized.

Next, the manner of the decoding will be explained hereinafter. Assuming that the received signals are $a_1', a_2', \ldots, a_{10}'$ corresponding to the transmitted signals $a_1, a_2, \ldots, a_{10}$, the syndromes will become $s_1$ and $s_2$ that are obtained by the following equations.

$$s_1 = a_1' + a_2' + a_3' + a_4' + \ldots + a_{10}' \quad (4)$$

$$s_2 = a_2' + \alpha a_3' + \alpha^2 a_4' + \ldots + \alpha^8 a_{10}' \quad (5)$$

In the decoder shown in FIG. 6, $s_1$ is an output of the first exclusive-OR circuit 51, and $s_2$ is an output of the second exclusive-OR circuit 52. The calculations up to this point are similar to those in the encoder shown in FIG. 5. When there occurs no error in $a_1', a_2', \ldots, a_{10}'$, both $s_1$ and $s_2$ become 0. When an error within one byte occurs, the error value and its position are obtained uniquely from $s_1$ and $s_2$. In this case, there are a maximum of 256 combinations of $s_1$ and $s_2$ so that patterns of all errors corresponding to $s_1$ and $s_2$ are stored as a table in a memory 54 having 32 bits×256 words. The third exclusive-OR circuit 53 takes exclusive-OR in every bit of the outputs from the memory 54 and $a_3', a_4', \ldots, a_{10}'$ so that the one byte error can be corrected.

As is explained above, it is possible to configure the encoder shown in FIG. 5 with only a small scale combinational logic circuit, and to configure the decoder shown in FIG. 6 with only a small scale combinational logic circuit and a small scale memory. Furthermore, because the circuit has the parallel configuration, the latency is very small.

Figure 4:
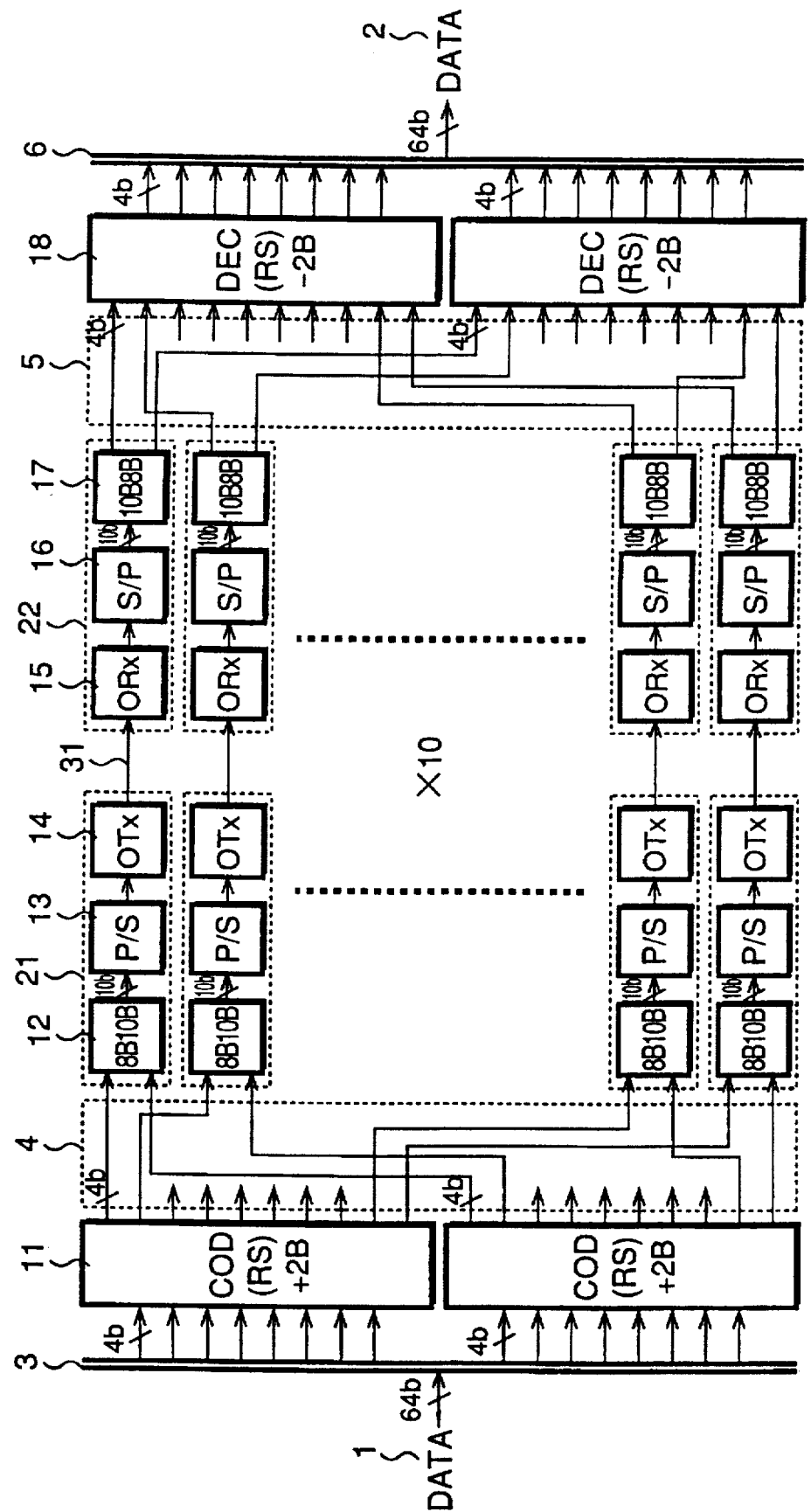
FIG. 4 is a diagram showing the configuration of a parallel data transmission unit of a second embodiment according to the present invention.

FIG. 4 shows a configuration of the second embodiment according to the present invention. The second embodiment is the case where, in the second aspect of the invention, k=64, m=4, d=8, i=2, t=1, l=10, n=8 and use is made of a one byte error correcting Reed Solomon code in which a byte length is of 4 bits and a code length is of 10 bytes.

When the above-mentioned values are substituted for the condition shown as that for the second aspect of the invention:

n=mti/p (where p is natural number), the left side=8 and the right side=4×1×2/p=8/p so that the condition is satisfied if p=1.

A parallel digital signal 1 which has a data width of 64 bits with 125 Mb/s of the transmission rate per bit width is divided into two parallel digital signals each of a 8 byte width with each byte being composed of 4 bits by byte divider 3. The divided signals are inputted to two encoders for error correcting code (COD) 11, respectively. In the encoders for error correcting code 11, the parallel signal inputted thereto is encoded into a one byte error correcting Reed Solomon code in which a byte length is of 4 bits and a code length is of 10 bytes. The parallel signal having 10 bytes in width outputted from the encoders 11 is distributed with one byte in width being present in every ten transmitters 21 by an interleaver 4. One byte is composed of 4 bits so that, in each transmitter 21, a signal having 4 bits in width is distributed from each of two encoders 11, and a parallel signal having a total of 8 bits in width is inputted. The transmitter 21 comprises an 8B10B encoder 12, a parallel/serial converter (P/S) 13 and an optical transmitter (OTx) 14. The parallel signal having 8 bits in width inputted thereto is encoded into 8B10B code and is converted into a parallel signal having 10 bits in width, which is then time-division multiplexed for transmission as one serial optical signal having a bit rate of 1.25 Gb/s. By the 8B10B encoding, it is possible to maintain the mark rate of the optical signal to be around ½ at all times. The optical signals outputted from the ten transmitters 21 are transmitted through ten optical fibers 31 and are received by ten receivers 22. The receiver 22 comprises an optical receiver (ORx) 15, a serial/parallel converter (S/P) is and a 10B8B decoder 17. The serial optical signal received is converted into a parallel electrical signal having 10 bits in width, and is then decoded into a parallel signal having 8 bits in width. The frame synchronization is established by the feedback to the serial/parallel converter 16 so as to ensure that the correct decoding is always conducted at the 10B8B decoder 17. The parallel signal having 8 bits in width outputted from the receiver 22 is deinterleaved by a deinterleaver 5 in correspondence to the interleaving format at the transmitting end, and the resulting signal is inputted to two decoders 18 for error correcting code. The decoder 18 carries out one byte error correction with respect to the signal having 10 bytes in width and outputs a signal having 8 bytes in width. The signal having a total of 16 bytes in width outputted therefrom is integrated by means of a byte integrater 6 and is outputted as a parallel digital signal 2 having 64 bits in width. According to this embodiment, for the condition given above, namely:

n=mti/p (where p is natural number), p=1 so that it is possible to correct the burst error having an arbitrary length in a set of a transmitter 21 and a receiver 22. Therefore, even in the case where the optical fiber 31 happens to be cut or the deviation of the frame synchronization occurs, it is possible to make the complete correction of the error caused thereby.

The byte length of the byte error correcting code, the code length, the number of error which can be corrected in a code-word, the data width of the parallel digital signal to be transmitted, the bit rate, the transmission data width per set of a transmitter and a receiver and so on shown in the first and second embodiments are only examples and can be determined appropriately depending on uses or applications. For example, if one byte error correcting and two byte error detecting code are used instead of one byte error correcting code, it is possible to prevent the correction error even if two byte error occurs at the same time.

In the first and the second embodiments, the optical fiber transmission system is used, but it is possible to use an electrical transmission system with a coaxial cable, a twisted pair cable or wireless, and an free space optical transmission system. In these embodiments, the parallel signal is converted into a serial signal to transmit, but it is possible to transmit the parallel signal as it is, for example, by means of a parallel optical interface using an optical fiber ribbon cable.

The 8B10B code as a transmission line code is used in the second embodiment, but it is possible to use other code, for example, 4B5B code or scrambling technique using pseudo-random pattern, and it is also possible to transmit an error correcting code itself as shown in the first embodiment.

In the encoder and the decoder for error correcting code in the first and second embodiments, the multiplication in Galois Field is conducted by the combinational logic circuits and, in the decoder thereof, the memory is used in the calculation to obtain the error value and its position from the syndrome. However, these are mere examples. For instance, it is possible to conduct the multiplication in Galois Field by a memory and to conduct the calculation to obtain the error value and its position from the syndrome by the combinational logic circuit.

As is explained in detail in the embodiments, by the application of the present invention to the parallel data transmission unit which transmits a parallel digital signal by the parallel arrangement of a plurality of transmitters and receivers, it is possible to obtain the parallel data transmission unit in which a byte error can be corrected and, moreover, there is almost no increase in the amount of hardware in the encoder and decoder and in the signal delay compared with the arrangement using an SEC-DED code as employed in a conventional semiconductor storage unit.

Especially, according to the second aspect of the invention, it is possible to correct the burst error having an arbitrary length in the p pairs of a transmitter and a receiver (where p is a natural number obtained by the condition of the second aspect of the invention). Therefore, it is possible to obtain the parallel data transmission unit which, even if the failure occurs in the p pairs of a transmitter and a receiver, enables the complete correction of the error caused thereby.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A parallel data transmission unit which transmits a plurality k of parallel time-series digital signals (k being an integer not less than four) using a plurality of transmitters and receivers, said unit comprising:

a byte divider which divides said k time-series digital signals into a plurality i of parallel digital signal sets (i being an integer not less than two), with each set composed of d parallel bytes (d being an integer not less than one) and with each byte composed of m parallel bits (m being an integer not less than two);

a plurality i of encoders, each of which encodes one of said digital signal sets to output a code-word of a byte error correcting code capable of correcting t byte errors and composed of l parallel bytes;

an interleaver which interleaves the outputs of said encoders to provide inputs to said plurality of transmitters;

a deinterleaver which deinterleaves parallel digital signals output from said plurality of receivers;

a plurality i of decoders coupled to said deinterleaver, each of which decodes one of said code-words as transmitted to output one of said parallel digital signal sets;

a byte integrator which integrates said parallel digital signal sets to output said plurality k of parallel digital signals.

2. A parallel data transmission unit according to claim 1, which satisfies the conditions: k=64, m=4, d=8, i=2, t=1 and l=10.

3. A parallel data transmission unit according to claim 1, in which a transmitter receives n parallel digital signals, and n=mti/p (p being an integer).

4. A parallel data transmission unit according to claim 3, which satisfies the conditions: k=64, m=4, d=8, i=2, t=1, l=10 and n=8.

* * * * *